US008712067B2

(12) United States Patent
Semcken

(10) Patent No.: US 8,712,067 B2
(45) Date of Patent: Apr. 29, 2014

(54) SYSTEM AND METHOD OF IMPROVING AUDIO SIGNALS FOR THE HEARING IMPAIRED

(75) Inventor: Kevin R. Semcken, Evergreen, CO (US)

(73) Assignee: Able Planet Incorporated, Wheat Ridge, CO (US)

( * ) Notice: Subject to any disclaimer, the term of this patent is extended or adjusted under 35 U.S.C. 154(b) by 16 days.

(21) Appl. No.: 12/529,541

(22) PCT Filed: Mar. 14, 2008

(86) PCT No.: PCT/US2008/057073
§ 371 (c)(1),
(2), (4) Date: Aug. 23, 2010

(87) PCT Pub. No.: WO2008/113012
PCT Pub. Date: Sep. 18, 2008

(65) Prior Publication Data

US 2010/0303249 A1 Dec. 2, 2010

Related U.S. Application Data

(60) Provisional application No. 60/894,737, filed on Mar. 14, 2007.

(51) Int. Cl.
*H04R 29/00* (2006.01)
*H03G 5/00* (2006.01)

(52) U.S. Cl.
USPC ................. 381/58; 381/103; 381/60; 381/98; 381/316; 381/400

(58) Field of Classification Search
USPC ............... 381/56–60, 98–109, 150, 300–303, 381/396, 312–331, 400–410
See application file for complete search history.

(56) References Cited

U.S. PATENT DOCUMENTS

| | | | | |
|---|---|---|---|---|
| 5,361,306 | A * | 11/1994 | Garcia | 381/98 |
| 5,430,802 | A * | 7/1995 | Page | 381/96 |
| 6,876,750 | B2 | 4/2005 | Allred et al. | |
| 7,068,793 | B2 | 6/2006 | Shim | |
| 7,167,571 | B2 * | 1/2007 | Bantz et al. | 381/312 |
| 7,584,010 | B2 | 9/2009 | Waldron et al. | |
| 7,978,867 | B2 | 7/2011 | Waldron et al. | |
| 2004/0042625 | A1 * | 3/2004 | Brown | 381/103 |
| 2006/0029248 | A1 | 2/2006 | Waldron et al. | |
| 2006/0215844 | A1 * | 9/2006 | Voss | 381/60 |

FOREIGN PATENT DOCUMENTS

KR 10-1989-0017997 A1 12/1989

OTHER PUBLICATIONS

WO 96-35314 A1 (Topholm 7 Westermann APS) Nov. 7, 1996.
Written Opinion and ISR in International Application No. PCT/US2008/057073 mailed Aug. 12, 2008.

(Continued)

*Primary Examiner* — Xu Mei
(74) *Attorney, Agent, or Firm* — William J. Kubida; Peter J. Meza; Hogan Lovells US LLP

(57) ABSTRACT

A system and method for using an audiogram and audio filters to provide improved audio characteristics for hearing impaired listeners by equalizing the received sound level of the signal across the frequency spectrum. The system and method further provide for modifying an audio signal based on the personal hearing characteristics of a listener to compensate for hearing loss.

10 Claims, 4 Drawing Sheets

(56) References Cited

OTHER PUBLICATIONS

Shields, Michael D.; Method and Apparatus for Modifying an Audio Signal; U.S. Appl. No. 60/837,752; Aug. 15, 2006; 16 pp.
EU Search report, application No. 08743923.8-910/2137729 PCT/US2008057073, dated Mar. 1, 2013, pp. 6.

* cited by examiner

SYSTEM AND METHOD OF IMPROVING AUDIO SIGNALS FOR THE HEARING IMPAIRED

CROSS REFERENCE TO RELATED APPLICATION

This application claims priority to a previously filed U.S. Provisional Patent Application No. 60/894,737, filed Mar. 14, 2007. The aforementioned application is incorporated herein by reference.

FIELD OF THE INVENTION

The system and method described herein relate to improving the clarity and intelligibility of audio signals.

Further the system and method relate to the alteration of audio signals to provide enhanced audio signal clarity and quality for applications in telephonics and in the recording and playback of audio signals for listeners having normal hearing and for the hearing impaired.

BACKGROUND OF THE INVENTION

Hearing impairment, to a greater or lesser extent, affects more than 30 million people in the United States, according to the American Academy of Audiology. Hearing impairment can affect its victim in a variety of ways, such as a reduced comprehension of conversation or spoken words, or reduced ability to hear and enjoy music.

Many technologies have been developed to reduce the impact of hearing impairment on those who suffer from it. These technologies include a variety of hearing aids, diagnostic techniques and related devices.

One device for improving the comprehension of an audio signal by a hearing impaired person is the LINX COIL™. This device has been described in the following commonly-owned patent documents: Provisional Patent Application 60/837,752 filed Aug. 15, 2006, patent application Ser. No. 11/188,519 filed Jul. 25, 2005, and patent application Ser. No. 10/864,691 filed Jun. 9, 2004. The Linx device, described more fully below, alters an audio signal in a variety of ways to provide improved clarity and comprehension for hearing-impaired listeners.

Diagnostic techniques allow quantification and characterization of the hearing impairment suffered by any individual person. One common diagnostic technique within audiology involves the production of an audiogram. An audiogram is typically created by testing a subject person with an audiometer.

An audiometer presents controlled acoustic stimuli to the subject through a set of headphones or other transducers. The tonal stimuli vary in frequency across the spectrum of sound normally within the range of human hearing. The subject indicates, through a feedback device, the sounds which are audible to the subject.

The audiometer records the lowest level of sounds to which the subject responds at each of the frequencies. The resulting chart provides a visual representation of the hearing loss of the test subject across frequency. Frequencies at which the test subject required louder sound levels before the signal was audible indicate frequencies at which the test subject has suffered hearing loss.

Audiometers may include multi-band equalizers and may provide modes that simulate a hearing aid or simulate hearing loss by altering the relative levels of frequency bands within a test signal.

DESCRIPTION OF THE INVENTION

Before proceeding with the detailed description, it should be noted that the present teaching is by way of example, not by limitation. The concepts presented herein are not limited to use or application with one specific type of system and method for improving audio signals.

Thus, although the instrumentalities described herein are for the convenience of illustration and explanation, shown and described with respect to exemplary embodiments, the principles disclosed herein may be applied to other types and applications of audio signal improvement systems and methods without departing from the scope of the present invention.

DETAILED DESCRIPTION

Figure 1:
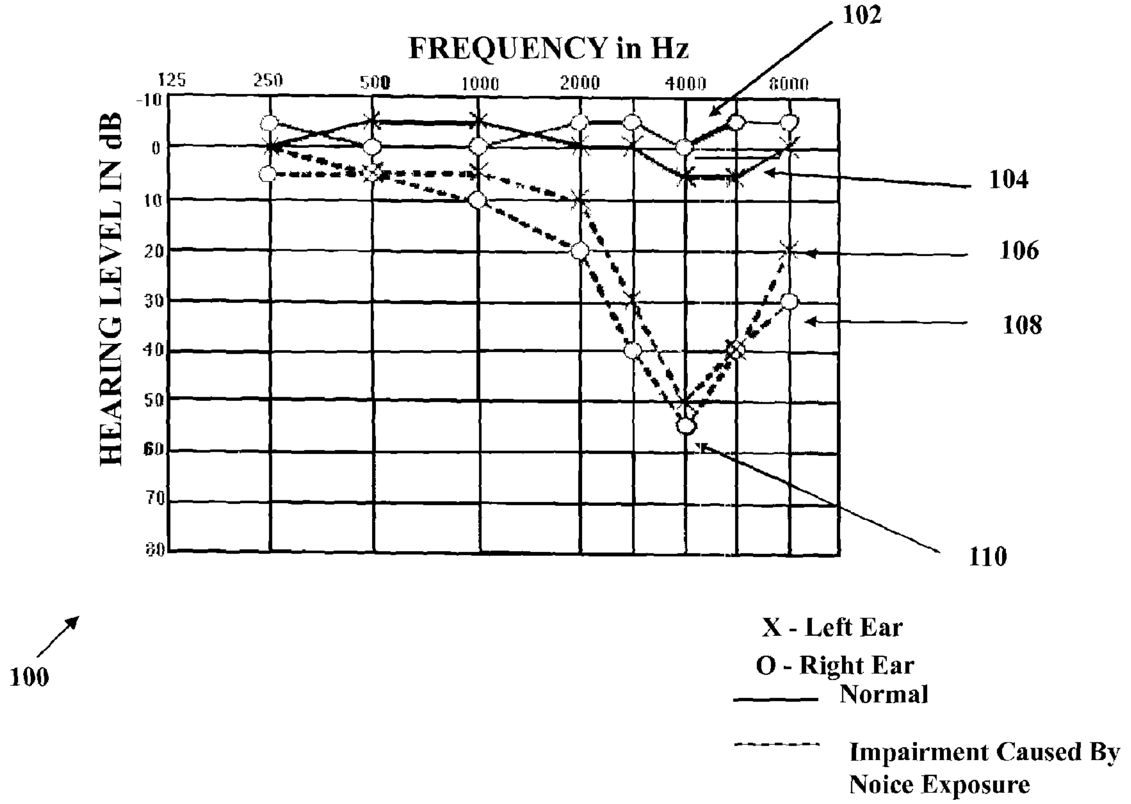
FIG. 1 is an example audiogram generated by an audiometer, showing the hearing frequency response curves for a person with normal hearing and a person with impaired hearing.

Referring to FIG. 1, an audiogram 100 is shown that represents the hearing response of two people. The audiogram 100 is a chart graphing the minimal sound level to which a person responds at a variety of frequencies across the spectrum typically within the range of human hearing. The information for each person is represented by two lines on the chart, one for each ear.

In FIG. 1, the hearing response typical of a person of normal hearing is represented by lines 102 and 104, representing the hearing response of the right and left ears, respectively. The response of the normal hearer is relatively constant across the spectrum of frequencies to which a normal ear responds. The normal hearer can hear sounds of roughly 0 dB, with some variation about that accepted normal level.

In comparison to the response of a person with normal hearing, lines 106 and 108 in FIG. 1 represent the hearing response of a person suffering from hearing impairment. The lines 106 and 108 dip down significantly across a part of the frequency spectrum near point 110, indicating that the test subject required a louder sound before hearing response was triggered at those frequencies. Audiogram characteristics will differ for every person in response to their specific hearing responses. The varying attributes of the audiogram may be characteristic of a specific type of hearing damage, and thus may help diagnose varying kinds and severities of hearing impairment.

Audiograms are generated by an audiometer which prompts a subject with sounds of varying decibel levels and records the feedback of the user as to which sounds the user is able to hear. Audiometers are typically provided with headphones, a feedback device, a sound generation device and a response storage device. Audiometers may be dedicated electronic devices, or may be software loaded on a general purpose computer.

Equalizer devices are devices for equalizing the response of an audio signal across the frequency spectrum. A multi-band audio filter or equalizer provides a frequency specific increase or reduction to the loudness of specific frequency bands of an audio signal as measured in decibels, thereby altering the audio signal to be more pleasing to a listener. An equalizer may include a series of audio filters for high-band, low-band or bandpass filtration, and may include parametric equalization devices. The audio equalizer typically provides a means of receiving the desired boost or reduction applicable to each frequency band, such as sliders or buttons on the outside of the device, or software controls to input desired sound levels for each frequency band. The equalizer may comprise a dedicated electronic device, or it may comprise software on a general purpose computer. Such a software based equalizer may include system software components for the control of audio playback or generation by the computer.

The audiogram equalizer system described herein utilizes the hearing response data characterized by an audiogram to modify an audio signal generated by a person's home theater or home audio system. The modified audio signal has frequency characteristics that increase comprehension of the input audio signal to the person for whom the audiogram hearing response data was collected. The object of the audiogram equalizer system is to configure an equalizer with the data generated by the audiometer and, alternatively in combination with the LINX COIL™, to provide for improved hearing and comprehension of the audio signal for an impaired listener.

Figure 2:
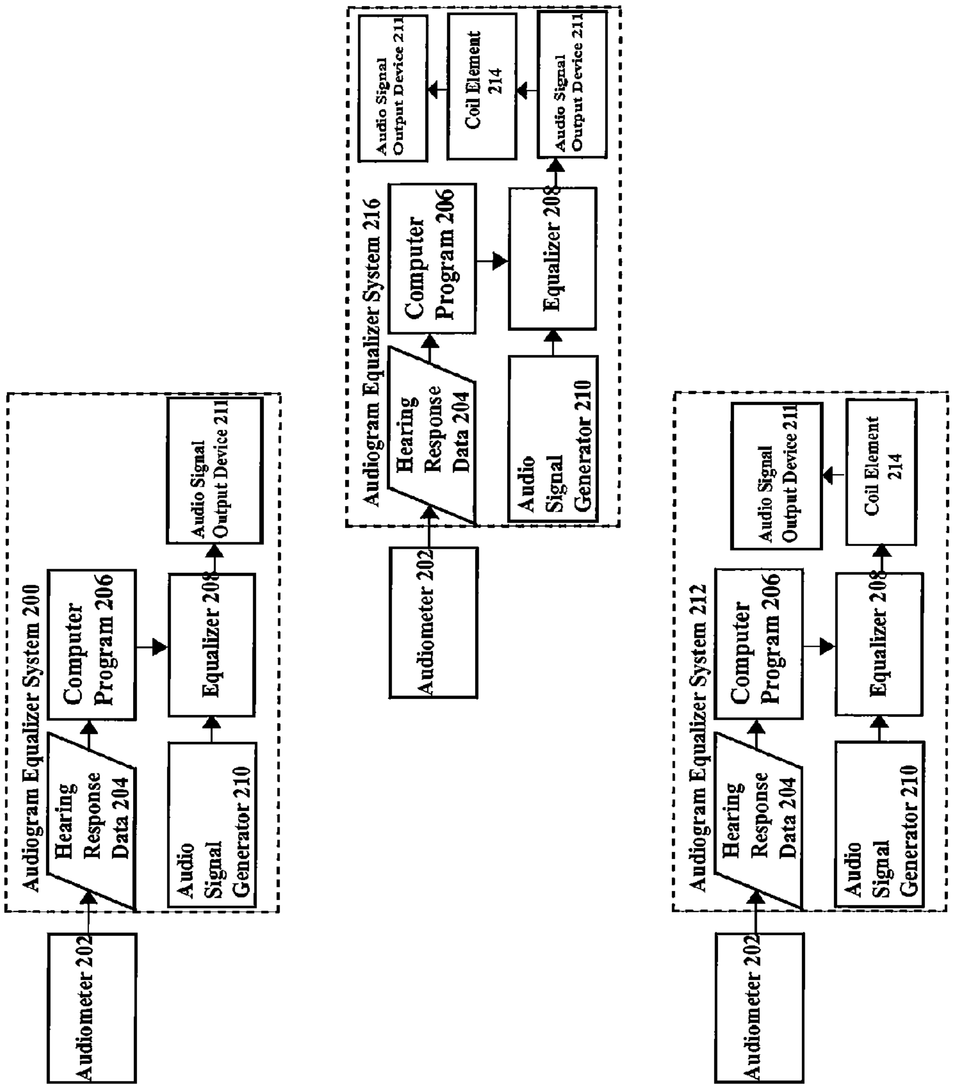
FIG. 2 is a schematic view of an embodiment of the system of the audiogram equalizer.

In FIG. 2 a schematic view of several embodiments of the audiogram equalizer system for improving the clarity of an audio signal are shown. Not all the elements of the systems shown in FIG. 2 need be incorporated into a single physical device. Multiple devices may be interconnected to produce the system of the audiogram equalizer, and other audio processing devices may be interposed in the system without affecting the applicability of the systems shown in this figure. Multiple elements of the system may be computer programs executing on one or more general purpose computer systems.

In a first embodiment, the audiogram equalizer system 200 receives data from audiometer 202 comprising a person's hearing frequency response data 204. Hearing response data 204 corresponds to data such as that shown on audiogram 100 and generated by audiometer 202, and is communicated to computer program 206.

The audiometer 202 may provide hearing response data 204 in printed form for manual input into computer program 206. Alternatively, audiometer 202 may be directly connected to computer program 206 via electronic or optical means for automatically receiving the hearing response data 204 into the computer program. The computer program 206 accepts and may store the hearing response data 204 in electronic form. The computer program 206 utilizes the hearing response data 204 to configure the equalizer 208.

In another alternative, the audiometer 202 and the equalizer 208 may be software executing on a general purpose computer or a special purpose computer. The audiometer 202 and equalizer 208 may be executing on the same or on multiple general or special purpose computers. In such a case, the hearing response data 204 may be communicated by the audiometer 202 to the computer program 206 and the equalizer 208 via electronic data files, interprocess communication, network communications, or other methods of communication between computer processes known in the art of computer science. In another embodiment of the system, the audiometer 202, the computer program 206 and the equalizer 208 may be incorporated into one electronic device or computer program, and may directly share and access the hearing response data 204.

Once the hearing response data 204 is input into the computer program 206 and configured into equalizer 208, the equalizer 208 is thereby configured to boost the decibel level of those frequency bands that are indicated to have hearing loss by hearing response data 204. Those frequency bands that show no loss in hearing response data 204 may receive no modification or may be attenuated to further equalize the audio signal passing through the equalizer 208. The specific boost or attenuation of each frequency band is proportional to the amount of hearing loss in that frequency band shown by hearing response data 204.

After the equalizer 208 is configured using the hearing response data 204, an audio signal may be input into the equalizer 208 by an audio signal generator 210. Audio signal generator 210 may be any one of many systems that produce audio signals in an electrical or optical form. For example, audio signal generator 210 may be a microphone, a CD player, a DVD player, a cassette tape player, a computer, a digital audio file player, a radio, a television, a telephone, a wireless telephone, a home stereo system, a home theater system or any other device for generating, processing, transmitting, storing or playing back an audio signal, or any combination of any number of such devices. The audio signal generated by audio signal generator 210 is input into equalizer 208, which attenuates or increases the decibel level of each frequency band of the audio signal depending on the configuration of the equalizer 208, and produces the result in a modified output audio signal.

The audio signal provided by the equalizer 208 is then provided to audio signal output device 211. Audio signal output device 211 may be an individual component such as an audio speaker, an audio amplifier, an audio-recording system, an audio transmission system, or other consumer or professional electronic components, or any combination of any number of such devices. Audio signal output device 211 may also be any combination of such electronic audio components for processing, amplifying, listening to or recording audio signals.

An alternative embodiment of the audiogram equalizer system is shown in FIG. 2 as system 212. The audiogram equalizer system 212 is similar to system 200 except as follows. In the alternative embodiment of system 212, the output audio signal provided by equalizer 208 is provided as an input to a LINX COIL™ element 214. The LINX COIL™ element 214 improves the clarity and loudness characteristics of an audio signal. The LINX COIL™ element 214 is comprised of a toroidal coil and a winding, further described in the description of FIG. 4 below. In the embodiment of the audiogram equalizer system 212 including the LINX COIL™, the coil element 212 accepts an audio signal from the equalizer 208. The LINX COIL™ element 214 modifies the audio signal produced by the equalizer 208 and provides a modified output signal. The modified output signal is accepted by an audio signal output device 211 or combination of such components, as described for system 200 above.

In another embodiment of the audiogram equalizer, shown in FIG. 2 as audiogram equalizer system 216, the coil element 214 may be incorporated into a system of audio signal output device 211 components. For example, the coil element 214 may be embedded in a home theater system, a home stereo system, a speaker, or other audio component. The systems incorporating the coil element 214 may be self-contained units including multiple functions such as reproduction, amplification, and sound production, or may be created by the combinations of multiple discrete components for audio processing and sound production. Coil element 214 may be interposed between any of these components or incorporated or embedded into any of them.

Figure 3:
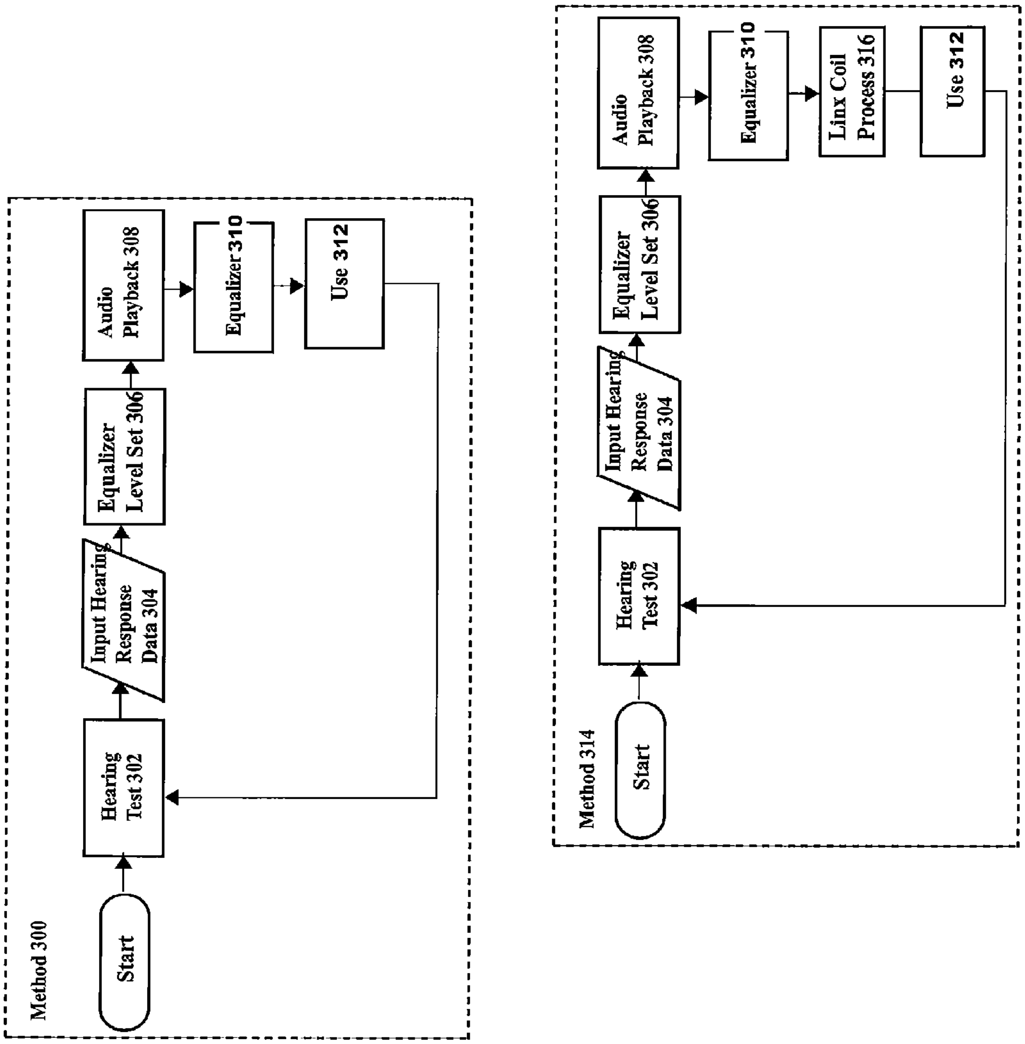
FIG. 3 is a schematic view of a method of using the system of the audiogram equalizer.

In FIG. 3, alternative methods of using the audiogram equalizer system are shown. In a first method 300 of using the audiogram equalizer, in hearing test step 302 a person's hearing is tested using an audiometer or similar device, generating an audiogram of the subject's hearing response across a frequency spectrum recorded as hearing response data. The hearing response data is input into the equalizer in step 304. In Equalizer Level Set step 306 the hearing response data input in step 304 on frequency response configures the boost or attenuation level of each frequency band in the audio equalizer. The hearing response data may be manually input into a series of input controls on the equalizer, may be automatically input via a direct data connection between the audiometer and the equalizer, or may be transferred from the audiometer to the equalizer in an electronic format. The hearing response data is used to configure the equalizer to alter an input audio signal by boosting or attenuating the level of each frequency band of the input audio signal in proportion to the hearing loss in that frequency band contained in the hearing response data.

Once the hearing response data 304 has been input into the equalizer in step 304 and configured to set levels in step 306, a user may playback audio through the system in step 308. Any device for generation of an audio signal may be used in step 308 to generate an audio signal for input into the equalizer of the system. Once the audio signal is input into the equalizer, the equalizer alters the audio signal in step 310 by boosting or attenuating the various frequency bands in the input signal in proportion to the hearing loss represented by the results of the hearing test performed in step 302.

The audio signal resulting from alteration in step 310 may be listened to by a user or stored for later enjoyment in use step 312. An example of the use of the audio signal in step 312 is playing the output audio signal through a loudspeaker for listening, recording the output signal, transmitting the output signal, or otherwise processing the signal by any professional or commercially available audio device, or any combination thereof.

In a second method of using the audiogram equalizer system, an additional step is added to process the audio signal through a LINX COIL™ element. In step 316, the output audio signal created by the equalizer by altering the input audio signal in step 310 is processed by the LINX COIL™ to add harmonics and in other ways improve the clarity and loudness characteristics of the signal, thereby improving comprehension of the signal by a hearing-impaired listener. The coil element may be incorporated into another audio device, and any number of other audio devices and components may be interposed between the equalizer and the coil element in this method of using the system.

Figure 4:
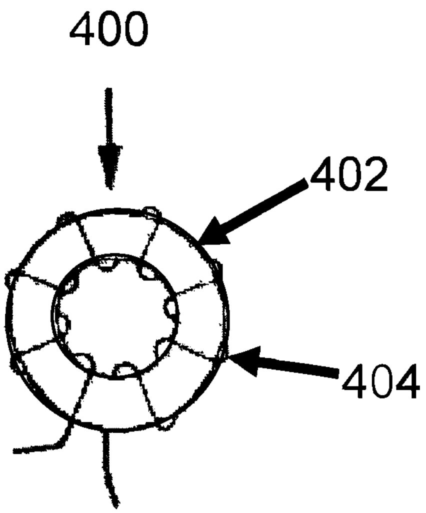
FIG. 4 is a view of an embodiment of the LINX COIL™ element.

Referring now to FIG. 4, a view of the LINX COIL™ element of the device is shown. The coil element 400 includes a toroidal core 402 and a winding 404. The core 402 may be made of a variety of materials including iron-bearing materials or other magnetic materials. The core 402 may also consist largely of air. When an audio signal passes through winding 404 a variety of physical properties of the LINX COIL™ are believed to process the audio signal in a manner that produces a modified audio signal with improved loudness and clarity characteristics, thereby providing hearing-impaired listeners with improved comprehension of the audio signals. There are several physical phenomena believed to provide the improved characteristics of audio signals processed by the LINX COIL™, which are discussed in several commonly owned patent applications, referenced earlier in this application. One such phenomena is the coherent distribution of the energy of the audio signal across higher harmonic frequencies that may be more intelligible to hearing-impaired listeners.

Changes may be made to the above methods, systems, and devices without departing from the scope hereof. It should be noted that the matter contained in the above description and/or shown in the accompanying drawings should be interpreted as illustrative and not in a limiting sense. The following claims are intended to cover all generic and specific features described herein as well as statements of the scope of the present invention, which, as a matter of language, might be aid to fall therebetween.

What is claimed is:

1. A system for altering an audio signal to compensate for a listener's hearing loss, the system comprising:
- a computer program for accepting frequency hearing response data representing the listener's hearing loss;
- an equalizer for accepting an input audio signal and providing a first modified audio signal, the equalizer being configured by the computer program to modify the input audio signal by boosting or attenuating a decibel level of one or more frequency bands in which the hearing response data indicates a hearing loss in proportion to the hearing loss in that frequency band contained in the hearing response data;
- a first audio signal output device electrically connected to the equalizer for accepting the first modified audio signal and providing a second modified audio signal;
- a second audio signal output device for audio playback; and
- a coil element disposed between the first and second audio signal output devices for accepting the second modified audio signal from the first audio signal output device and providing a third modified audio signal to the second audio signal output device.

2. The system of claim 1, wherein the hearing response data comprises hearing loss data for person on a plurality of frequency bands.

3. The system of claim 2, wherein the equalizer increases the relative sound level of frequency bands that show hearing loss in the frequency response data.

4. The system of claim 1, wherein the first and second audio signal output devices and the coil constitute a home theater or home audio system.

5. The system of claim 1, wherein the equalizer is a computer program executing on a general purpose computer.

6. A method of altering an audio signal to compensate for a listener's hearing loss, comprising:
- measuring a frequency response data for a hearing-impaired person;
- receiving the frequency response data into a computer program;
- configuring an equalizer to boost or attenuate a decibel level of one or more frequency bands based on the frequency response data;
- receiving an input audio signal from an audio playback system into the equalizer;
- producing a first modified audio signal by altering the input audio signal by boosting or attenuating a level of each frequency band of the input audio signal in proportion to the hearing loss in that frequency band contained in the hearing response data;
- processing the first modified audio signal through a coil element to add harmonics for producing a second modified audio signal; and
- providing the second modified audio signal to an audio device.

7. The method of claim 6, wherein the frequency response data is measured by an audiometer.

8. The method of claim 6, wherein the audio device is a home theater system or a home audio system.

9. The method of claim 6, further comprising recording the second modified audio signal.

10. The method of claim 6, wherein the providing includes transmitting the second modified audio signal.

* * * * *